(12) United States Patent
De Vries et al.

(10) Patent No.: US 7,491,429 B2
(45) Date of Patent: Feb. 17, 2009

(54) METHOD AND ARRANGEMENT FOR GENERATING AN ATMOSPHERIC PRESSURE GLOW DISCHARGE PLASMA (APG)

(75) Inventors: Hindrik Willem De Vries, Tilburg (NL); Fuyuhiko Mori, Tilburg (NL); Eugen Aldea, Eindhoven (NL); Mauritius Cornelius Maria Van De Sanden, Tilburg (NL)

(73) Assignee: Fuji Photo Film B.V., Tiburg (NL)

( * ) Notice: Subject to any disclaimer, the term of this patent is extended or adjusted under 35 U.S.C. 154(b) by 53 days.

(21) Appl. No.: 10/529,786

(22) PCT Filed: Sep. 30, 2003

(86) PCT No.: PCT/EP03/10923

§ 371 (c)(1),
(2), (4) Date: Nov. 3, 2005

(87) PCT Pub. No.: WO2004/030019

PCT Pub. Date: Apr. 8, 2004

(65) Prior Publication Data

US 2006/0147648 A1    Jul. 6, 2006

(30) Foreign Application Priority Data

Sep. 30, 2002  (EP)  ................... 02079074

(51) Int. Cl.
    *H05H 1/24*  (2006.01)
(52) U.S. Cl. ........................ 427/569; 118/715
(58) Field of Classification Search ............ 427/569; 118/715
See application file for complete search history.

(56) References Cited

U.S. PATENT DOCUMENTS

| | | | |
|---|---|---|---|
| 5,403,453 A * | 4/1995 | Roth et al. | 204/164 |
| 5,414,324 A * | 5/1995 | Roth et al. | 315/111.21 |
| 5,585,147 A | 12/1996 | Ogawa et al. | |
| 5,968,377 A * | 10/1999 | Yuasa et al. | 219/121.41 |
| 6,270,632 B1 * | 8/2001 | de Vries | 204/164 |
| 6,299,948 B1 * | 10/2001 | Gherardi et al. | 427/569 |
| 2003/0082412 A1 * | 5/2003 | Fukuda et al. | 428/697 |

FOREIGN PATENT DOCUMENTS

| | | |
|---|---|---|
| EP | 0699954 | 3/1996 |
| EP | 0790525 | 8/1997 |
| EP | 0821273 | 1/1998 |
| JP | 11005857 | 12/1999 |
| WO | WO 0223960 | 3/2002 |

OTHER PUBLICATIONS

International Search Report for PCT Appln. No. PCT/EP03/10923 mailed Jan. 29, 2004.

\* cited by examiner

*Primary Examiner*—Timothy H Meeks
*Assistant Examiner*—Elizabeth Burkhart
(74) *Attorney, Agent, or Firm*—Davidson Berquist Jackson & Gowdey, LLP

(57) ABSTRACT

Method and arrangement (1) for generating an atmospheric pressure glow plasma APG (7), where in a plurality of electrodes, (4, 5) are arranged defining a discharge space (10) for forming said plasma (7). The electrodes (4,5) are connected to a power supply (8) providing an AC-voltage having a frequency of at least 50 kHz to the electrodes (4,5). A gaseous substance (6) is provided in said discharge space and comprises t least one of a group of argon, nitrogen and air.

28 Claims, 6 Drawing Sheets

METHOD AND ARRANGEMENT FOR GENERATING AN ATMOSPHERIC PRESSURE GLOW DISCHARGE PLASMA (APG)

This application claims priority to European Patent Application No. 02079074.7, filed Sep. 30, 2002, and PCT Patent Application No. PCT/EP2003/010923, filed Sep. 30, 2003 which are incorporated by reference herein.

FIELD OF THE INVENTION

The present invention generally relates to a method and apparatus for generating atmospheric pressure glow discharge (APG) plasma and the use thereof. In particular it is related to a method and apparatus for generating an atmospheric glow discharge plasma (APG), wherein a plurality of electrodes are arranged defining a discharge space for forming said plasma.

BACKGROUND OF THE INVENTION

Modification or treatment of a surface by applying glow plasma is a known technique in industries, such as photo film production industry, used in order to improve certain surface and material properties. For instance, in the production of photo film, a thermoplastic polymer film (triacetyl cellulose (TAC), polyethyleneterephthalate (PET), polyethylenenaphthalate (PEN) or similar) is prepared using a glow plasma in order to improve adhesion properties of the surface.

Plasma is considered generally as a suitable solution for material processing, because it generates a large flux of reactive species (radicals, ions), which can be directed to the process zone and manipulated to the desired shape by using an appropriate electric field distribution. Plasma treatment would have considerable advantage if it could be generated at atmospheric pressure. Advantages of using atmospheric pressure are a larger density of reactive species than in the low pressure case, and the advantage of avoiding vacuum technology.

Another desired feature of atmospheric pressure glow plasmas (APG) is the generation of these plasmas at low temperatures around 300-400 K. This will make the technology applicable to the treatment of thermoplastic polymer surfaces, as is common in photo film production methods.

Generating a plasma under the above circumstances is not a straightforward technique. At atmospheric pressure, the particle density is high and as a result the mean free path of reactive species is small. The processes of excitation and ionisation are restricted to a limited area, and the plasma is generated primary in a filamentary form.

Plasmas at atmospheric pressures are very unstable and will tend to go into a spark or an arc in short time after the breakdown. Any random local increase in a current density will tend to grow rather than to be damped and plasma will be constricted.

Generating a plasma requires the supply of sufficient energy to a gas such that the gas is ionised. Within the plasma, collisions and interactions between elements of the gas create chemically or physically active species, such as metastables, ions, electrons, and others. Recombinations and transitions of excited elements to their ground state also causes the emission of photons from the plasma.

For the plasma to be sustained, sufficient free electrons should be present in the plasma. One of the solutions for obtaining a homogenous atmospheric plasma is the generation of a background pre-ionization, implying that sufficient seed electrons must be present in the reactor before the plasma breakdown. These seed electrons can be created as described above, through interactions within the plasma itself or can be generated as a result of interactions between the species present in the plasma and the surface of the electrodes.

In general an APG plasma is created by applying an AC-voltage to a plurality of electrodes. A substrate to be treated, such as a thermoplastic polymer film, may be transported along the surface of one or more of these electrodes. The frequency of the AC-voltage may be varied in order to improve the properties of the plasma.

The applicability of a plasma for use in material processing may be evaluated by determining the following parameters:
- the power coupled into the APG plasma calculated from the applied voltage and the plasma current;
- the exposure non-uniformity parameter, based on the statistical distribution of the exposure over the surface;
- the minimum time of exposure, wherein 99% of the surface is exposed to a surface plasma energy dose of at least 1 J/cm² (statistical fluctuations of the exposure taken into account).

The abovementioned exposure non-uniformity parameter and minimum time of exposure will be described in more detail below.

In a number of situations and applications, such as in material processing in photo film industry, it will be advantageous to have the plasma treatment time as short as possible. The plasma exposure time t is given by:

$$t = \frac{L}{v} \qquad (1)$$

wherein L is the length of the plasma reactor and v the line speed.

A short time of exposure allows the use of high line speeds and of "medium" size of APG reactors (L=10-20 cm). The energy dose required for reaching the maximum surface energy at the surface of the material to be treated may, as will be appreciated, depend on a number of factors, amongst which are the properties of the surface and the material. It is accepted that an atmospheric pressure glow plasma treatment with an energy dose of 1 J/cm² will be sufficient to reach the maximum surface energy. However in order to get an acceptable adhesion between a certain type of polymer such as Polyethylene (PE) and gelatin an energy dose of between 50 and 100 mJ/cm² may already be sufficient.

The minimum time of exposure required for treating a material is given by:

$$t_{minim} = \frac{SE_{minim}}{P} \qquad (2)$$

wherein P is the power consumed by plasma and S the active electrode surface, i.e. the part of electrode surface which is covered by plasma.

Since the plasma exposure is a stochastic process, whether or not a local part of the surface is exposed to the plasma is stochastic as well. This is represented by a stochastic parameter with an average value of P/S and with a certain dispersion from this average value. The minimum time of exposure is therefore determined by the requirement that with a certitude of 99% all elements of the surface are exposed to an energy dose of at least 1 J/cm². Depending on the plasma uniformity, the energy dose exposed to the surface may be considerable higher in some local sites at the surface.

Taking in account the statistical fluctuations of the exposure the minimum time of exposure is given by:

$$t_{minim} = \frac{SE_{minim}}{P\left(1 - 3\frac{\sigma D}{D}\right)} \quad (3)$$

wherein D is the energy dose received locally at the surface and σD the statistical dispersion (the mean standard deviation from the average value). The statistical dispersion of the exposure is calculated later in this document.

Another quality criterium of the treatment process is the uniformity of the plasma exposure. In order to establish a high level of uniformity it is required that fluctuations of the exposure are present only at microscopic scale (not detectable by the human eye: of the order of 100 μm or smaller). So with a certitude of 99%, any element of the surface of the material having a size of $10^{-4}$ cm², must be exposed to an energy dose of at least 1 J/cm².

It is important to note that for streamer discharges, like a corona or a silent discharge, it is very difficult to meet the criteria mentioned above. The cause of it is believed to be the repulsive forces of streamer space charge and the drop of the electric field near a streamer plasma. As a result, this type of discharge can not cover all the material to be treated and gaps of a few millimeters exist between the streamer discharges.

For a single pulse the dispersion (average relative variation) of the exposure over a surface unit of $10^{-4}$ cm² is given by:

$$\frac{\sigma D_{sp}}{D_{sp}} = \frac{\sigma(E_{pulse})}{E_{pulse}} \cdot \sqrt{\frac{S}{10^{-4}}} \quad (4)$$

wherein $D_{sp}$ is the energy dose per unit of surface per pulse, S is the electrode surface in cm² and $E_{pulse}$ is the energy delivered to the plasma by a single pulse. For obtaining equation (4) it was assumed that the value of the current density on each element of surface is statistically independent.

Assuming a Poisson statistical distribution of the exposure, the relative fluctuations of exposure for the exposure to N pulses will be:

$$\frac{\sigma D}{D} = \frac{\sigma(E_{pulse})}{E_{pulse}} \cdot \sqrt{\frac{S}{10^{-4}}} * \frac{1}{\sqrt{N}} \quad (5)$$

$$\frac{\sigma D}{D} = \frac{1}{\sqrt{ft}} \frac{\sigma(E_{pulse})}{E_{pulse}} \cdot \sqrt{\frac{S}{10^{-4}}}$$

herein f is the pulse frequency and N=ft is the number of plasma pulses received by an element of the surface, during movement of a material surface (for example a surface of a foil) through the APG reactor.

The value of the statistical fluctuation of the energy per pulse can be determined from the waveforms of the plasma current and the applied AC-voltage using 16 sample pulses. Hence $$\sigma E_{pulse} = \sigma(\int I_{plasma}(t) U(t) dt) \quad (6)$$

wherein $I_{plasma}$ is the plasma current and the U is the AC-voltage applied to the electrodes of the APG reactor.

Taking in account statistical fluctuations of exposure and equation (2), the minimum time of exposure is determined as follows:

$$\frac{P}{S} t_{minim} \left(1 - 3\frac{\sigma D}{D}\right) = 1 \text{ J/cm}^2 \quad (7)$$

$$\Downarrow$$

$$\frac{P}{S}\left[t_{minim} - 3\sqrt{\frac{t_{minim}}{f}} \left(\frac{\sigma(E_{pulse})}{E_{pulse}} \cdot \sqrt{\frac{S}{10^{-4}}}\right)\right] = 1 \text{ J/cm}^2$$

$$\Downarrow$$

$$t_{minim} = \left(F + \sqrt{F^2 + \frac{SE_{minim}}{P}}\right)^2;$$

$$F = \frac{3}{2}\sqrt{\frac{1}{f}} \left(\frac{\sigma(E_{pulse})}{E_{pulse}} \cdot \sqrt{\frac{S}{10^{-4}}}\right)$$

Equations (5) and (7) clearly reveal the importance of a high frequency in order to reduce the time of exposure and to increase the uniformity. The minimum time of exposure, defined by equation (7), is strongly dependent on the requirements for the treatment of PEN, PET and PE for improvement of coating adhesion, and further depends on the minimum exposure and the size of surface on which significant non-uniformities are admissible.

A parameter which reflects the plasma uniformity and which can be used to compare atmospheric pressure glow (APG) plasmas for different working conditions and applications, is the variation of exposure over a surface of 1 cm² (after a single pulse exposure):

$$\delta D = \frac{\sigma D_1}{D_1} = \frac{\sigma(E_{pulse})}{E_{pulse}} \cdot \sqrt{\frac{S}{1}} \quad (8)$$

In the following δD (measured as a percentage) will be named exposure non-uniformity parameter hereinafter, and will be used as a plasma quality parameter together with the minimum time of exposure, as defined by equation (7).

The exposure uniformity may be checked by a toner test, visualising the charge distribution of charge on the surface.

In this case the ratio d between the size of the toner build-up spots and the distance between the toner build-up spots is:

$$d = \sqrt{\frac{S}{\pi}} \cdot \frac{\sigma(E_{pulse})}{E_{pulse}} \quad (9)$$

Several attempts have been made in order to generate a stable atmospheric glow plasma.

In U.S. Pat. No. 6,299,948 there is disclosed a method for generating a uniform plasma through a proper combination between the AC voltage and the frequency in a nitrogen gas. The frequency range used is 200 Hz to 35 kHz, with a preference frequency below 15 kHz, and an amplitude of the applied voltage in the range between 5 to 30 kV.

However, processing of materials in plasma at higher frequencies is beneficial due to the increased number of discharges over time. Although the charge generated per pulse and the energy per pulse are only slightly changing with the frequency, when the operating frequency is increased the number of pulses per unit of time increases. Therefore the average power (energy released per unit of time) increases and the average current (charge released per unit of time) increases almost proportionally with the frequency. As a consequence, the material processing is faster than at lower frequencies and, as will be appreciated, this presents a clear benefit for the industrial process.

U.S. Pat. No. 5,414,324 describes an apparatus and method for generating a uniform atmospheric pressure glow discharge plasma in a frequency range of 1 to 100 kHz. The frequency ranges used in this document are based on the model of ion trapping, i.e. where mobility of the ions is so low that they will be trapped in the plasma gap whereas the mobility of the electrons is sufficiently high and can reach the electrodes. A gas is present between the discharge electrodes, which gas at least comprises one of air, nitrous oxide or a noble gas such as argon, helium, neon, etc. The document however suggests that for higher frequencies the plasma becomes unstable and cannot be sustained anymore.

The application of helium as reaction gas at high frequency plasma generation has been performed more often. European patents EP 0 790 525, EP 0 821 273 and EP 0 699 954 disclose methods and arrangements for generating a glow plasma at high frequencies.

EP 0 790 525 discloses the generation of plasmas at 10 kHz in air and 40 kHz, 450 kHz and 13.56 MHz in He with small amounts of $N_2$ and/or $O_2$. The gas is purged through holes in the electrodes of the arrangement used. Measurements of the adhesion properties of plasma treated PET and PEN reveals that an operating frequency of 450 kHz is favourable to improve adhesion effectiveness. Both corona and plasma treated samples are compared in these documents showing that plasma provides superior adhesion properties.

An improved embodiment in EP 0 821 273 describes the adhesion properties of plasma treated PEN, wherein the plasma is generated in (combinations of) helium and nitrogen as compared to air for use as a reaction gas, at frequencies of 10 and 450 kHz. The arrangement used is a corona-like setup comprised of bare titanium parts positioned in parallel to a drum. The drum is covered with a silicone layer and a polymeric film is transported on the drum through the discharge space. The discharge space is filled with a gas essentially comprising helium and the polymeric film is exposed to an atmospheric glow discharge. Some experiments were performed with a reaction gas essentially comprising $N_2$ at a frequency of 10 kHz.

In U.S. Pat. No. 5,585,147 there is disclosed a method for treating the surface of a glass fabric with an atmospheric pressure glow discharge plasma for cleaning the surface, improving the adhesion properties thereof and coating the surface with a organosilane compound. The glass fabric is treated with a plasma generated in a carrier gas which is essentially comprised of helium and/or argon, and which carrier gas is mixed with a reaction gas. In order to achieve the desired cleaning performance and adhesion properties, the gas mixture is preheated to temperatures between 100° C. and 600° C., before generating the plasma. These temperatures however make this plasma unsuitable for surface treatment of temperature sensitive substrates, such as thermoplastic polymer films.

The application of helium however in methods for generating APG plasmas at high frequency (>50 kHz) of the AC-voltage, is not favourable. Helium occurs in the atmosphere in a concentration of approximately 5 ppm (parts per million). Some natural gas deposits however have been found to contain significant amounts of helium and therefore most helium is obtained from these national gas deposits. Some of the deposits contain helium in a concentration above 0.3% by volume. Most of the helium in the world comes from natural gas deposits found in Texas, Oklahoma, Kansas and The Rocky Mountains.

Helium is extracted from natural gas streams using a low temperature liquefaction process. This low temperature method separates crude helium—a mixture of more than 50% helium with nitrogen and small amounts of other gasses—from the liquefied portion which consists predominantly of hydrocarbons. Several other techniques including pressure swing adsorption (PSA) and some cryogenic processes, are used to refine crude helium into a concentrated helium product. Helium is an expensive gas due to the fact that it is rare and difficult to extract. It is mainly for this reason that the use of helium is preferably avoided in applications described above.

Another drawback of the application of helium is that due to the specific weight of helium (0.17 g/l), helium is very volatile. For this reason helium gas will always try to escape through the smallest holes of the arrangement. More countermeasures such as appropriate sealing and a more complex system for the gas injection means are required in arrangements using helium as a reaction gas.

Lastly, helium with an atomic weight of 4 will release a relatively small amount of energy in a collision with the surface to be treated. The use of larger, more heavy particles will exchange larger amounts of energy and will assist in the physical treatment of the surface. Therefore, in applications such as surface activation and etching, helium will not be the most favourite choice.

Further to this, heating of the carrier gas in the discharge space, such as is done in U.S. Pat. No. 5,585,147, is not a preferred option for treating thermoplastic polymer films, such as is done in photo film production industry. The higher temperatures may damage the thermoplastic polymers, for instance due to melting thereof. On the other hand, it has been experienced that the temperature automatically rises to some extend due to energy dissipation.

SUMMARY OF THE INVENTION

It is an object of the present invention to provide a cost effective method for generating a stable uniform low-temperature atmospheric pressure glow discharge plasma at high operating frequencies of the AC-voltage with outstanding surface treatment capabilities.

These and other objects of the invention are achieved by a method for generating an atmospheric pressure glow discharge plasma (APG), wherein a plurality of electrodes are arranged defining a discharge space for forming said plasma, wherein said electrodes are connected to a power supply and an AC-voltage is applied to said electrodes, and wherein a gaseous substance is provided in said discharge space, wherein said AC-voltage applied to said electrodes has an amplitude equal to at least the breakdown voltage of said gaseous substance and has a frequency of at least 50 kHz, and said gaseous substance essentially comprises at least one of a group comprising argon, nitrogen and air.

The inventors have discovered that with an AC-voltage of a frequency of 50 kHz and above, by keeping the applied AC-voltage amplitude equal to at least the breakdown voltage (wherein the breakdown voltage is characteristic for each carrier gas used), dissipation of energy can be reduced substantially. Therefore, the temperature in the discharge space may be controlled. Another important finding of keeping the applied AC-voltage at the levels mentioned above is that the uniformity of the generated glow discharge plasma, as it is defined in equation (8), has been significantly improved. A decrease in the minimum exposure time as defined by equation (7) has also been found. The present invention provides thus, a low temperature in the discharge space, a short exposure time and a high level of uniformity of the APG. Hence, this invention can be applied in various process industries including those where thermoplastic polymers are involved having a low glass temperature ($T_g$), since thermal damage to the thermoplastic polymer can be prevented. As will be appreciated, the applied voltage must be sufficiently large in order to maintain a glow discharge plasma. But it has been found that the amplitude of the applied voltage should not be too high, at least not higher than 140% of the breakdown voltage of the applied gaseous substance.

In order to further control the temperature in the discharge space, the gaseous substance is kept at a temperature lower than 100° C. Preferably the gas is kept at room temperature, i.e. temperature between 20° C. and 30° C.

In the case of a delicate polymer having a low critical temperatures (e.g. low the glass transition temperature), we may further reduce the temperature applied to the polymer by reducing the residence time of the film in the discharge space. This may be achieved by moving the film through the discharge space with a certain velocity and adapting the velocity such that the desired residence time, for which the temperature of the film is kept such that the film remains intact, is achieved. Reducing the residence time (e.g. by adapting the velocity of the film) may be performed independent of reducing the AC-voltage amplitude as described above; either of these measures may be performed separately or both together.

An increase of the AC-voltage frequency yields an increasing build up of metastables, interacting with the electrodes and the plasma to improve plasma stability and density. Increase of the frequency furthermore yields build up of the number of active species contributing to the suppression of filamentary discharge. This behaviour has been established in argon, air, nitrogen and helium, however other gasses did not reveal this behaviour.

Argon, nitrogen and air are comprised of much larger and heavier atoms than helium (Ar 40, $N_2$ 28, air is a mixture of roughly 78% $N_2$, 20% $O_2$, 1% Ar and 1% $H_2O$ and some other fractions) and the use of said gasses is preferred in applications for surface treatment, in the light of the above discussion. It will further be appreciated that the use of air, nitrogen or argon is a more cost effective solution than the use of helium. For this reason, the invention improves the applicability of AGP plasmas at high frequencies in a number of industrial processes.

Good results have been achieved in particular by providing an atmosphere rich of argon in the discharge space. It has been observed that a stable and uniform APG plasma can be achieved this way.

In an embodiment of the invention, the AC-voltage is reduced to levels of at most 140% of the breakdown voltage, after the plasma has been generated. A preferred range of the applied AC-voltage after establishing the plasma is between 110% and 120% of the breakdown voltage.

In another embodiment the gaseous substance comprises, in addition to argon, at least one further gas such as one or more of a group comprising $O_2$, $CO_2$, $NH_3$, common precursor gasses such as $SiH_4$, hydrocarbons, organosilicons such as TEOS and HMDSO, or organo-metallics and combinations thereof. As was observed, in the presence of quantities of these gaseous chemical substances, a plasma can be sustained more easily. The carrier gas (comprised of either Ar, $N_2$, air or combinations thereof) may comprise up to 50% other gasses by volume, although good results can be achieved using concentrations of approximately 20% by volume.

A preferred embodiment of the present invention comprises at least the steps of essentially stabilizing the plasma, such that a homogeneous plasma is achieved in the presence of the carrier gas, and providing the further gasses mentioned above to the discharge space such that the concentration of said further gas is fractionally increased stepwise. Each step of fractionally increasing the concentration is followed by a step of stabilizing the plasma by adjusting the AC-voltage, until a stabile plasma at a desired concentration is achieved.

A stepwise fractional increase as mentioned may involve gas concentration increments of the concentration of further gasses, which increments are relatively small as compared to the finally desired concentration. For example, increasing the concentration to its maximum desired value in for instance 4 steps (of 25% of the total) or 10 steps (10% of the total) or even 20 steps (5% of the maximum desired concentration) are regarded as relatively small steps as compared to the finally desired concentration.

Defining the voltage rise time as the shortest time interval needed for the sine voltage to raise/decrease from zero voltage amplitude to maximum/minimum voltage amplitude, stabilising the plasma may be achieved by adjusting the voltage characteristics such that the voltage rise time is in the range of 0.1 to 10 kV/µs. An optimum is reached with values in the range of 0.1 to 5 kV/µs.

It has also been observed that a stabile APG plasma can be easily achieved by keeping the plasma current density below 10 mA/cm$^2$.

The effects and benefits mentioned above may be enhanced in an embodiment where the discharge space is flowed through by said gaseous substance.

An embodiment of the present invention, directed to the treatment of a substrate film by a plasma may be achieved when at least one of the electrodes supports the substrate film to be treated. Said substrate film may be transported through the discharge space over the surface of the at least one electrode, exposing the substrate to the AGP plasma discharges.

In yet another embodiment of the present invention at least one of the electrodes is covered with a dielectric material. It has been observed that the surface of the dielectric plays a decisive role in the stability and performance of the plasma.

Above-mentioned dielectric material is not necessarily of the same nature as the substrate film to be treated. The dielectric material may be coated on the surface of at least one of the electrodes in order to improve the behaviour of the APG-plasma.

It has further been observed that a method provided by the invention can be used under the circumstances (with reference to the operation parameters) presented in the table below:

| Parameter | Description | Range | Optimum |
|---|---|---|---|
| U | AC-voltage amplitude | 100%-140% of breakdown voltage. | 110%-120% of the breakdown voltage |
| f | AC-voltage frequency | 50 kHz-1 MHz | 100-700 kHz |
| $\phi_{vol, gas}$ | volumetric gas flux of gas flow | 1-50 l/min | 10 l/min |
| flow velocity | | 0.1-10 m/s | 1-5 m/s |
| $d_{gap}$ | gap distance between | 100-5000 µm | 250-1500 µm |

-continued

| Parameter | Description | Range | Optimum |
|---|---|---|---|
| | electrodes on opposite sides of the discharge space | | |
| $d_e$ | thickness of dielectric material on at least one electrode | 1-1000 μm | 250-500 μm |
| concentration further gasses present in carrier gas | volumetric percentage | <50% | approximately 20% |
| Voltage rise time | shortest time from zero to maximum/minimum voltage | 0.1-10 kV/μs | 0.1-5 kV/μs |
| Plasma current density | | 0-10 mA/cm$^2$ | ≦5 mA/cm$^2$ |

Note that for carrier gasses such as argon, nitrogen and air, the desired voltages are in the range of 1-6 kV.

In another aspect of the invention there is provided an arrangement for generating an atmospheric pressure glow discharge plasma (APG), comprising a plurality of electrodes arranged such that a discharge space is defined by said electrodes, further comprising means for applying an AC-voltage having a frequency of at least 50 kHz to said electrodes, and means for providing a gaseous substance to said discharge space, characterised in that said means for providing a gaseous substance to said discharge space are arranged for essentially providing at least one of a group comprising argon, nitrogen and air.

The above mentioned invention may be applied in various processes in industry, such as in surface activation processes wherein substrate can be glass, polymer, metal, etcetera (specific examples of this are modification of surface properties such as improving adhesion or creating hydrophobic or hydrophilic properties); in the chemical vapour deposition process where specific chemical compositions gasses such as SiH4, hydrocarbons, organosilicons (TEOS, HMDSO, etc.) or organo-metallics are usually involved; in deposition processes of polymers and in deposition processes for oxidic materials; in the surface cleaning processes of various substrates where sterilisation or dry cleaning purposes can be realised. Furthermore the invention may also be excellently applied below atmospheric pressures, such as between 100 mbar and 1 bar (atmospheric pressure).

The present invention will now be further elucidated by description and drawings referring to a preferred embodiment thereof, directed to the treatment of a substrate service with an APG. The invention is not limited to the embodiments disclosed, which are provided for explanatory purposes.

DETAILED DESCRIPTION OF THE DRAWINGS

Figure 1:
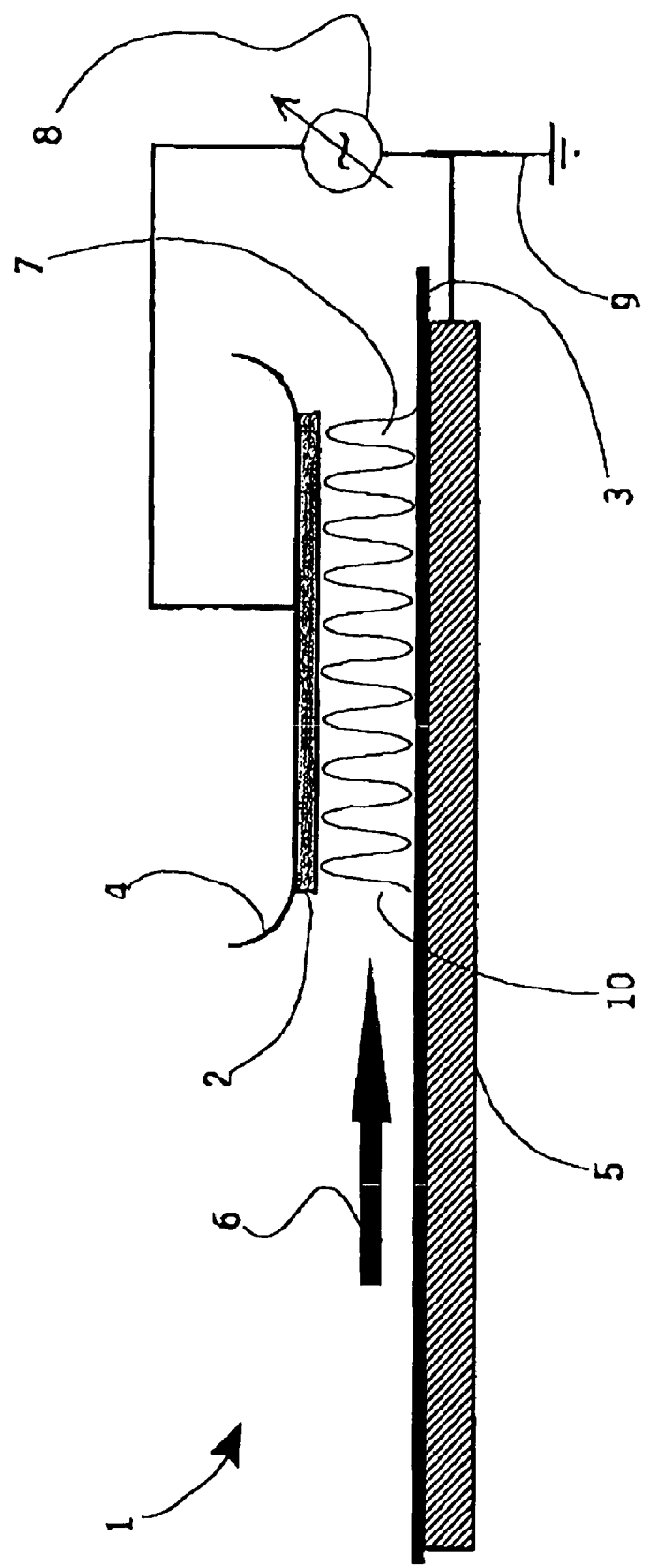
FIG. 1 is a schematic drawing of an arrangement for carrying out a method according to the present invention.

In FIG. 1 an arrangement for generating plasma 1 comprises a dielectric 2 connected to a first electrode 4. A second electrode 5, arranged for carrying a substrate film 3, is arranged on the opposite side of a discharge space 10. A gas flow 6 may be established parallel to the surfaces of said dielectric 2 and substrate film 3. First electrode 4 has been connected to an adjustable AC power supply 8, arranged for providing an AC-voltage with a frequency larger than 50 kHz. Second electrode 5 has been connected to said AC power supply 8 as well as to ground 9.

In a method according to the present invention, a gas flow 6 is established comprising at least one of a group of argon, air and nitrogen. For example, pure argon may be used as a carrier gas, or alternatively a mixture of argon and air or nitrogen and argon may be used in arbitrary concentrations. The examples described hereinafter have been carried out with nitrogen, air and argon. Surprisingly, it has been observed that with a method according to the present invention, the presence of argon, air or nitrogen as a carrier gas has a positive influence on the plasma stability and intensity.

After establishing a gas flow, the electrodes 4, 5 are energised by the adjustable AC power supply 8. Power supply 8 has been adjusted such that an AC voltage with an amplitude in the range of 3-6 kV, at most 40% higher than the breakdown voltage (optimally the amplitude may be between 10% and 20% higher than the breakdown voltage), at a frequency in the range of 50 kHz-1 MHz (optimum 100-700 kHz) is provided. Upon reaching a breakdown voltage, a plasma 7 will be generated between the dielectric 2 and the substrate film 3. Simultaneously, the substrate film 3 may be moved in any direction past the plasma in order to treat said film 3 along its full surface.

The carrier gas may further comprise oxygen, carbon dioxide, NH$_3$, common precursor gasses such as SiH$_4$, hydrocarbons, organosilicons such as TEOS and HMDSO, or organo-metallics or any combination or mixture of these gasses. These gasses may be present in the carrier gas from the beginning of the process. Good results have been achieved by adding the further gasses after a step of stabilising the plasma. This adding can be done best in fractional stepwise increments and by stabilising the plasma after each step until a desired concentration is established (for instance 20%).

A stepwise fractional increase as mentioned may involve gas concentration increments of the concentration of further gasses, which increments are relatively small as compared to the finally desired concentration. For example, increasing the concentration to its maximum desired value in for instance 4 steps (of 25% of the total) or 10 steps (10% of the total) or even 20 steps (5% of the maximum desired concentration) are regarded as relatively small steps as compared to the finally desired concentration.

Alternatively, the addition of chemically reactive gases to the carrier gas is done after a homogenous glow plasma was ignited in the carrier gas and operated for approximately 10-20 s. The concentration of the reactive gas added to the carrier gas is gradually increased in steps of a few percent of the concentration followed by a gradual increase of the voltage applied to the plasma with about 5-10% per step in order to maintain the plasma stable.

The dielectric 2 may comprise a material such as PET, PEN, PTFE or a ceramic such as silica or alumina. Any combination or mixture may be used as well. In photo film production industry, the substrate film 3 may be a support for photo sensitive layers, which is treated with an APG plasma first, in order to improve its adhesion properties before adding said photo sensitive layers. The support may be any suitable polymer, but often materials such as PEN, PET, TAC, PE, or Polyolefin laminated paper will be used for this purpose.

Stabilising the plasma may be achieved by adjusting the voltage characteristics such that the voltage rise time is in the range of 0.1 to 10 kV/μs. An optimum is reached with values in the range of 0.1 to 5 kV/μs. The voltage rise time is dependent on the frequency and the amplitude of the AC-voltage and is influenced by the dielectric permeability of the dielectric 2 and the thickness of the dielectric material.

It has also been observed that a stabile APG plasma can be easily achieved by keeping the plasma current density below 10 mA/cm$^2$, especially at plasma current density equal to or lower than 5 mA/cm$^2$.

The distance between the dielectric 2 and the substrate film 3, forming the discharge space 10, may be in the range of 0.1-5 mm, with an optimum distance of 250-1500 μm. The volumetric gas flux of gas flow 6 may be within the range of 1 l/min and 50 l/min, with an optimum around 10 l/min. The thickness of dielectric 2 may be in a range of 1-1000 μm, with an optimum between 250 μm and 500 μm.

Figure 2:
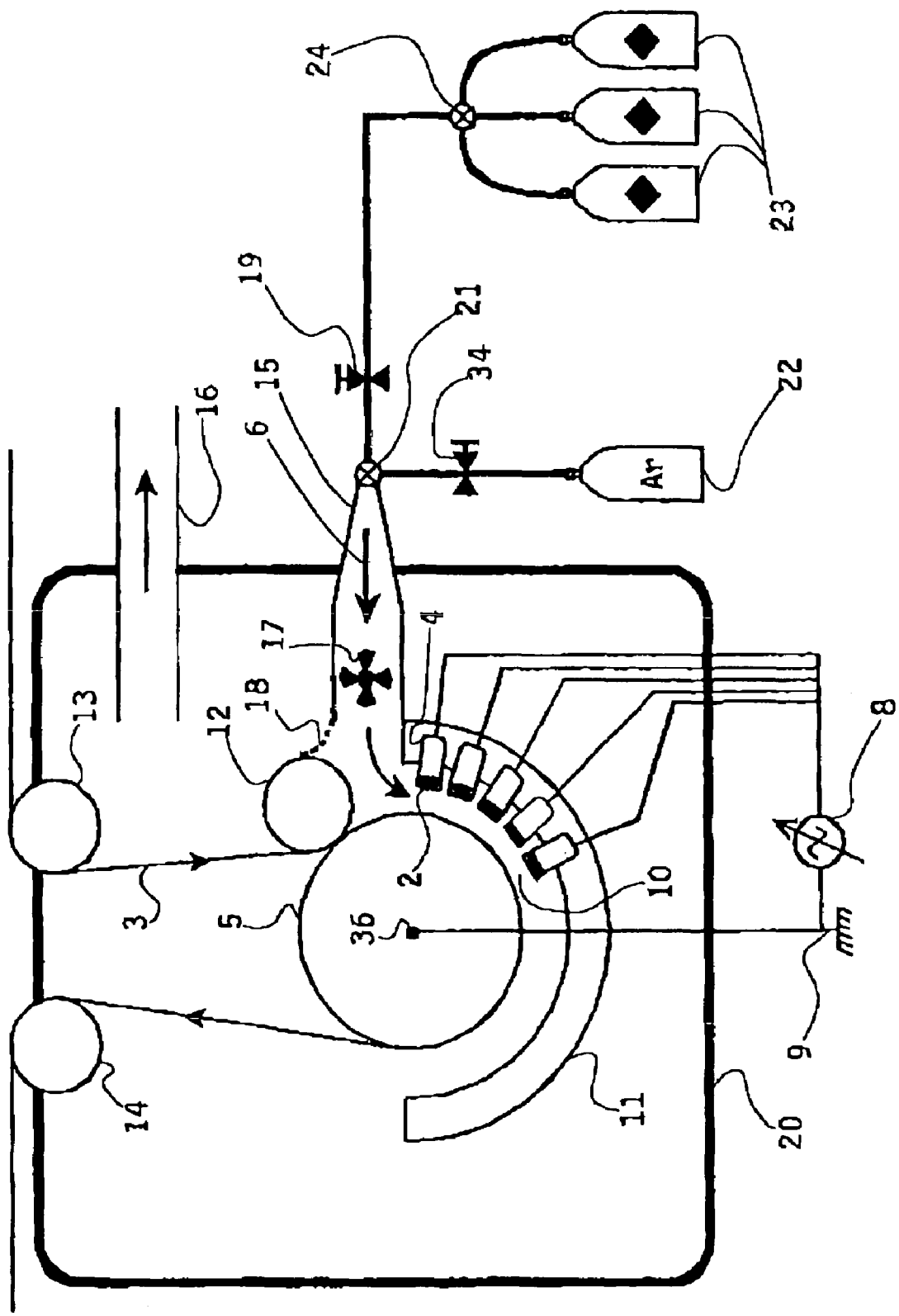
FIG. 2 is a drawing of an APG-plasma treatment device for treating substrate films.

FIG. 2 shows a device according to the present invention for treating a substrate film 3, such as a photo film. In this device electrodes 4 form the inside of a half circle around roll shaped drum electrode 5. The electrodes 4 are attached to an electrode holder 11. The drum shaped electrode 5 is a roll supporting a substrate film 3, which film 3 can be moved through a discharge space 10, formed by said electrodes 4 and 5, by a rotating motion of drum electrode 5. A dielectric coating 2 may be comprised on the electrodes 4 or, underneath the supported film 3, electrode 5. Note that only a few electrodes 4 are shown in FIG. 2. The electrodes 4 are connected to an output of adjustable power supply 8, while the other output of power supply 8 and drum electrode 5 by connection 36 are connected to ground 9.

Via support roll 13 the substrate film 3 is brought inside treatment chamber 20, and is lead over drum electrode 5 via supporting roll 12. After treatment, substrate film 3 will leave the treatment chamber 20 via supporting roll 14. In use, a plasma will be generated in discharge space 10 by energizing said electrodes with adjustable power supply 8. The surface of substrate film 3 is treated by said plasma as it is moved through said discharge space 10.

The treatment chamber further comprises a gas inlet 15, a gas outlet 16, and means 17 for establishing a gas flow 6 in the discharge space 10. A flexible wall 18 between inlet 15 and support roll 12 prevents the forming of a direct gas flow between inlet 15 and outlet 16. As a result, a gas flow 6 is forced to flow through discharge space 10.

Gas flow 6 essentially comprises at least one of a group of argon, air, nitrogen or combinations thereof. Additionally further gasses may be added to the gas flow 6, such as oxygen, carbon dioxide, NH$_3$, common precursors used in chemical vapour deposition processes or any combination of these gasses. Preferably the amount of other gasses present in the carrier gas does not exceed 50% by volume. One or more gas storage means 22 comprising argon, air or nitrogen (as an example a gas bottle comprising argon is shown in FIG. 2) is therefore connected to the gas inlet 15, via adjustable valve 34 and element 21 combining a plurality of gas flows as shown. Said further gasses, such as oxygen, carbon dioxide, NH$_3$, common precursors, etcetera, mentioned above may be stored in a plurality of storage means 23 and added by element 24. Element 24, adding the further gasses used is connected to element 21 via adjustable valve 19, which valve 19 may be stepwise adjustable such that the concentration of further gasses can be increased or decreased stepwise. It will be appreciated that a continuously adjustable valve enables stepwise adjustment of the concentration as well. The use of a stepwise adjustable valve 19 is therefore preferred, but remains optional.

Stepwise adjustable valve 19 enables a method as described herein-above, wherein the adding of further gasses is performed in fractional stepwise increments and by stabilising the plasma after each step until a desired concentration of further gasses is established. It will further be appreciated that the requirements for the valve 19 are determined by the magnitude of the fractional steps desired (some examples are given below).

One or more current choke coils (not shown) may be added to the arrangement in order to control the voltage during plasma breakdown.

The invention will further be described by describing a number of embodiments thereof, which embodiments have (amongst other embodiments) been tested in a laboratory environment.

EXAMPLE 1

In a first example, an atmospheric pressure glow discharge plasma was generated by applying argon gas at room temperature with a velocity of 2 m/s into the discharge space at an amplitude of the applied voltage of 1.4 kV. Both electrodes are covered with a dielectric material comprising of polyethylene-naphtalate and having a thickness of 100 micrometers. The gap distance between the electrodes (typically forming the discharge space) is 1 mm. An LC matching network is incorporated in the plasma arrangement. The results of the measurements are listed in the table below.

| f [kHz] | P [W] | δD [%] | $t_{minim}$ [s] |
|---|---|---|---|
| 1 | 15 | 28 | 89 |
| 129 | 20 | 14 | 59 |
| 29 | 28 | 10 | 41 |
| 70 | 50 | 5 | 2 |
| 300 | 120 | 2 | 9 |

Figure 3:
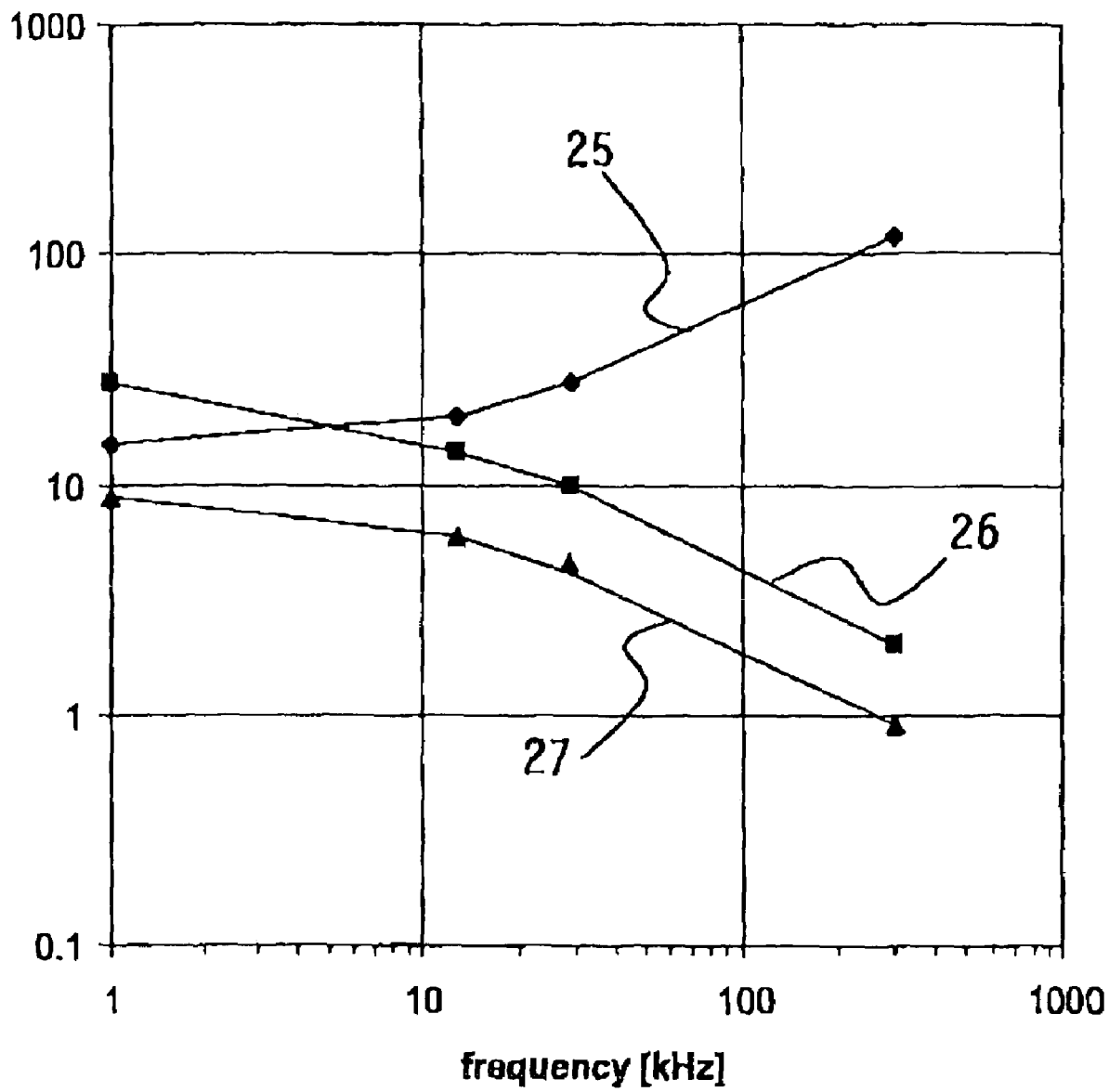
FIG. 3 shows a diagram of the dependency of plasma quality parameters in a plasma generated according to the present invention using Ar as the carrier gas.

FIG. 3 shows a diagram of the dependency of plasma quality parameters, as defined earlier in this document, on the frequency. The diagram shows the power P coupled into the APG plasma 25, the exposure non-uniformity parameter δD 26 and the minimum time of exposure $t_{minis}$ 27. The parameters are based on measurements of the AC-voltage applied and the plasma current and are the results of a comparative study of the properties of an argon (Ar) plasma at low and high frequency of the AC-voltage applied. The values are plotted on a double logarithmic scale.

The advantages of generating an APG plasma at high frequencies (>50 kHz) are supported by the results shown in this diagram. The power density increases almost a factor 10 whereas the treatment time and non-uniformity parameter decrease a same order of magnitude. In addition (not shown in FIG. 3) it was discovered that large gaps (dimensions of the discharge space) are allowed without any destabilizing occurring in the plasma.

EXAMPLE 2

Figure 4:
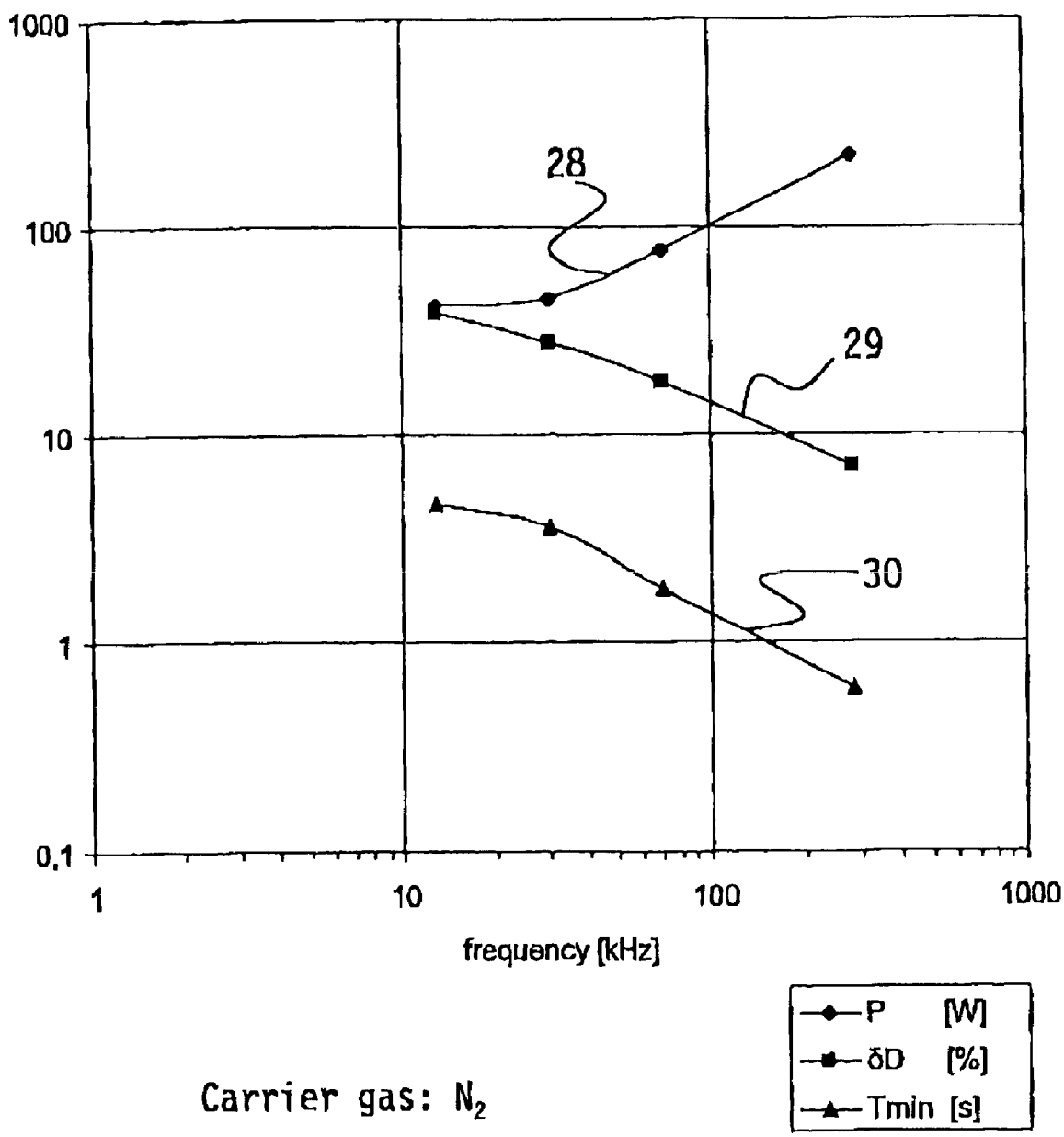
FIG. 4 shows a diagram of the dependency of plasma quality parameters in a plasma generated according to the present invention using N$_2$ as the carrier gas.

In a second example, an atmospheric pressure glow discharge plasma was generated by applying nitrogen gas ($N_2$) with a velocity of 2 m/s into the discharge space at an amplitude of the applied voltage of 4.5 kV. Both electrodes are covered with a dielectric material comprising of polyethylenenaphtalate (PEN) and having a thickness of 100 μm. The gap distance between the electrodes (typically forming the discharge space) is 1 mm. An LC matching network is incorporated in the plasma arrangement. The results of the measurements are listed in the table below and are presented in the graph in FIG. 4. Again the power P coupled into the APG plasma 28, the exposure non-uniformity parameter δD 29 and the minimum time of exposure $t_{minim}$ 30 are shown.

| f [kHz] | P [W] | δD [%] | $t_{minim}$ [s] |
|---|---|---|---|
| 129 | 42 | 39 | 46 |
| 30 | 45 | 28 | 36 |
| 70 | 78 | 18 | 2 |
| 282 | 220 | 7 | 6 |

EXAMPLE 3

Figure 5:
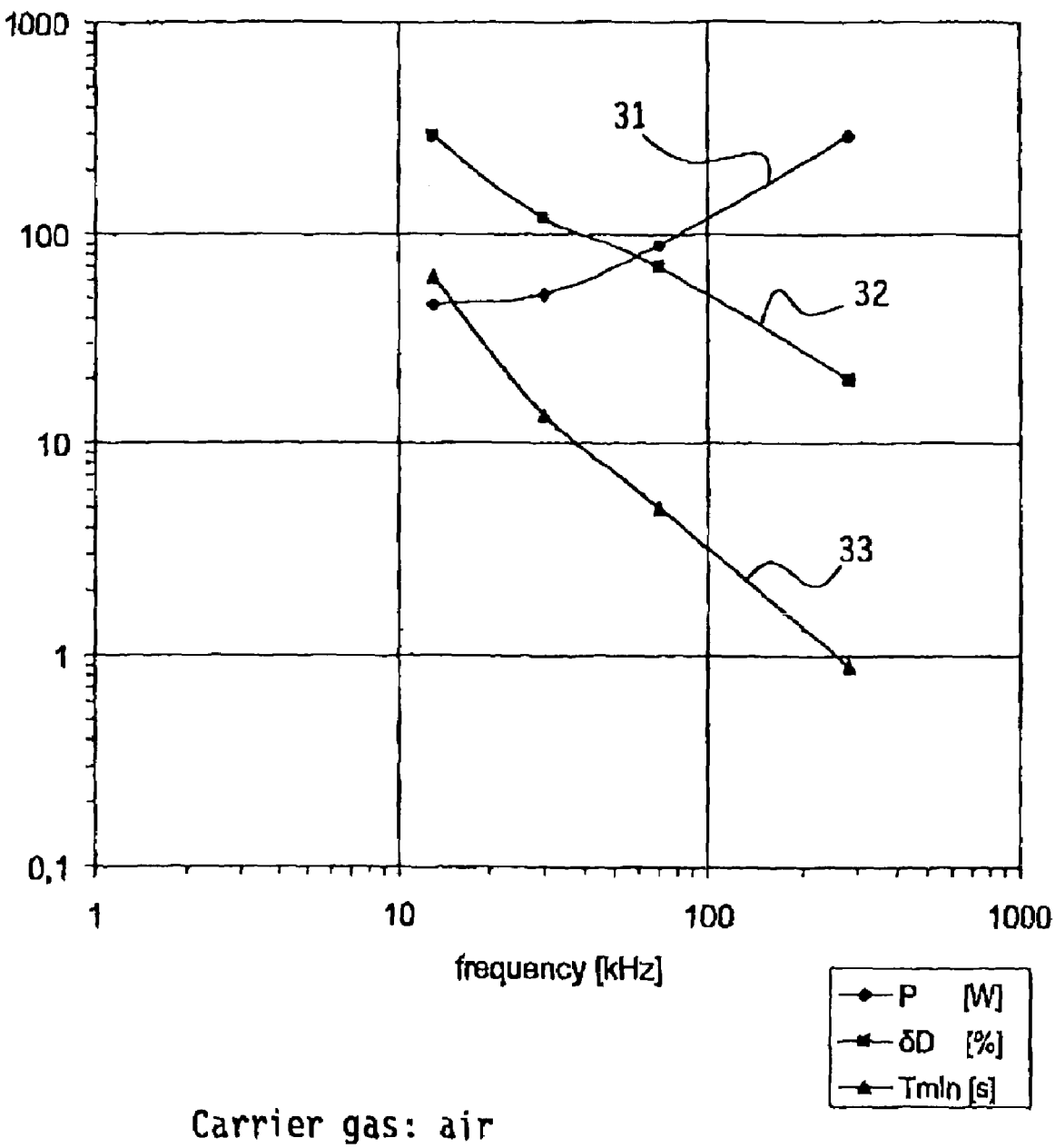
FIG. 5 shows a diagram of the dependency of plasma quality parameters in a plasma generated according to the present invention using air as the carrier gas.

In a third example, an atmospheric pressure glow discharge plasma was generated by applying air with a velocity of 2 m/s into the discharge space at an amplitude of the applied voltage of 4.5 kV. Both electrodes are covered with a dielectric material comprising of polyethylenenaphtalate (PEN) and having a thickness of 100 μm. The gap distance between the electrodes (typically forming the discharge space) is 1 mm. An LC matching network is incorporated in the plasma arrangement. The results of the measurements are listed in the table below and are presented in FIG. 5. Again the power P coupled into the APG plasma 31, the exposure non-uniformity parameter δD 32 and the minimum time of exposure $t_{minim}$ 33 are shown.

| f [kHz] | P [W] | δD [%] | $t_{minim}$ [s] |
|---|---|---|---|
| 129 | 46 | 290 | 63 |
| 30 | 52 | 120 | 135 |
| 70 | 89 | 70 | 5 |
| 282 | 290 | 20 | 9 |

EXAMPLE 4

Figure 6:
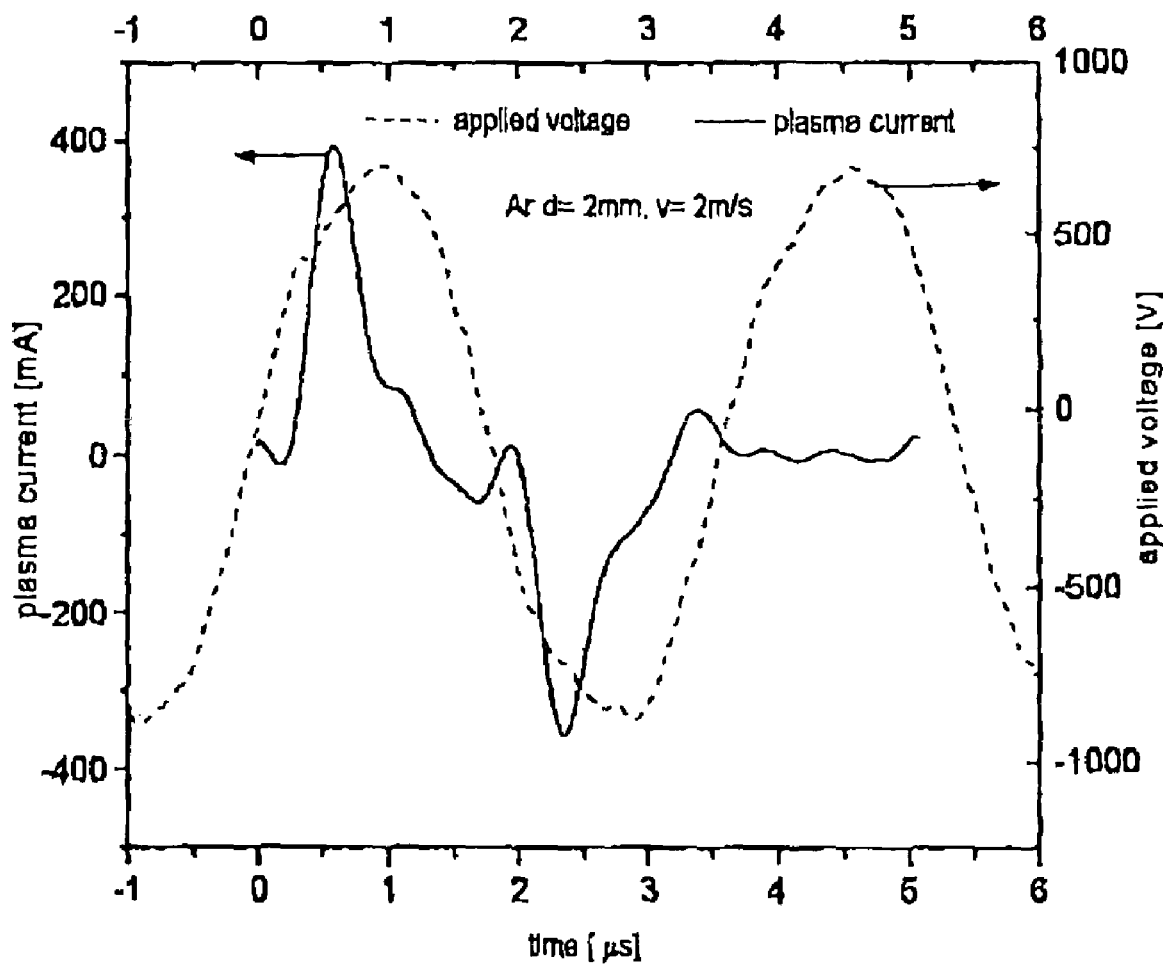
FIG. 6 is a characteristic of the applied voltage and the plasma current in a plasma generated using a method or arrangement according to the present invention.

As an example of a measurement at a frequency of approximately 280 kHz, FIG. 6 presents a diagram of the AC-voltage applied to the electrodes and the plasma current of a plasma generated using a method or arrangement according to the present invention. In this particular example, the carrier gas used was argon at a flow velocity of 2 m/s, the gap distance was 2 mm. The plasma current is shown by the solid line and the applied voltage by the dotted line.

The results of the above-mentioned experiments show a stable APG plasma can be generated in the presence of argon, nitrogen and air at high frequency. However the operation window for maintaining a uniform and stable plasma for the nitrogen and air gasses are rather limited. For argon gas said phenomena is surprisingly not observed. On the other hand, it is observed that at frequency ranges between 200 to 500 kHz, the plasma non-uniformity of the gasses are one order of magnitude smaller than those obtained in the frequency between 1 and 10 kHz. Said observation shows a clear benefit for generating APG plasmas at a higher frequencies, preferably at a frequency of at least 50 kHz. More preferable is a frequency in the range of 100 to 1 MHz, and most preferable in the range of 100-700 kHz.

The increased stability of plasma at high frequency is believed to be ascribed to the role of metastables providing the pre-ionization which required for a glow plasma breakdown. Due to the frequency increase the interval between the discharge pulses decreases and consequently the density of metastables present in the discharge space from the previous discharge pulse increases.

Although the increase of frequency shows benefits with respect to the material processing efficiency, it is challenging to generate an atmospheric glow plasma at frequencies higher than 1 MHz. This can be attributed to the requirement that during the unstable state of plasma (the plasma breakdown) the voltage applied to the plasma must decrease as fast as possible. This may be achieved by covering the electrodes with a dielectric (dielectric barrier discharge system, DBD). After the breakdown, the electric field generated by the plasma charge which is accumulating on the dielectric surface will decrease the voltage applied to the plasma.

When the frequency increases, the rise time of the applied voltage will also increase and also the duration of the transitional state during which the voltage applied to the plasma increases before being lowered by the field of the charge accumulated on the dielectric.

Additionally, the maximum allowed plasma current with a DBD system increases proportional with the frequency, so that at higher frequencies the current can be very high increasing the probability of the glow to an (unfavourable) arc transition.

For the purpose of comprehensiveness, it is noted here that numerous modifications and variations of the present invention are possible in the light of the above teachings. It is therefore understood that, within the scope of the amended claims, the invention may be practised otherwise than as specifically described herein.

The invention claimed is:

1. A method for generating an atmospheric pressure glow discharge plasma (APG) for treating substrates comprising the steps of:
    providing a plurality of opposing plate electrodes to define a discharge space for forming said APG plasma there between,
    spacing the opposing plate electrodes by a gap ranging from 100 μm to 5000 μm,
    supplying a continuous stream of gaseous substance into the discharge space,
    providing power to the plate electrodes sufficient to form a uniform electric field between the plate electrodes and generating a stable glow plasma there between,
    controlling the power being provided in the form of an AC-voltage applied to said plate electrodes to be at an amplitude that is equal to or less than 140% of the breakdown voltage of said gaseous substance provided within the discharge space and at a frequency of at least 50 kHz, and
    maintaining the relationship between the AC voltage and the breakdown voltage as the gaseous substance is being supplied and the plasma continues to be generated to thereby control and reduce the temperature applied to the substrate.

2. The method according to claim 1, wherein said AC-voltage amplitude is between 110% and 120% of said breakdown voltage.

3. The method according to claim 1, wherein the temperature of said gaseous substance is lower than 100 C.

4. The method according to claim 1, wherein said AC-voltage is chosen to comprise a frequency less than 1 MHz.

5. The method according to claim 4, wherein said frequency of the AC-voltage is chosen within a ranged of 100 kHz to 700 kHz.

6. The method according to claim 1, wherein a residence time for treating a thermoplastic polymer film in said discharge space is chosen such that said thermoplastic polymer film is kept at a temperature below a glass transition temperature of a thermoplastic polymer film.

7. The method according to claim 6, wherein said residence time is controlled by moving said film through said thermoplastic polymer discharge space while controlling the velocity of said thermoplastic polymer film.

8. The method according to claim 6, wherein the amplitude of said AC-voltage is chosen such that the temperature of the discharge space remains below a glass transition temperature of said thermoplastic polymer film during treatment of said thermoplastic polymer film and for maintaining said glow plasma.

9. The method according to claim 6, wherein said thermoplastic polymer film comprises at least one of a group comprising triacetyl cellulose(TAC), polyethyleneterephthalate (PET), polyethylene-naphthalate (PEN) and similar thermoplastic polymers.

10. The method according to claim 1 wherein at least one of said plate electrodes is covered with a film of dielectric material.

11. The method according to claim 10, wherein said film of dielectric material is chosen comprising a thickness in a range of 1 μm to 1000 μm.

12. The method according to claim 11, wherein said thickness lies within a range of 250 μm to 500 μm.

13. The method according to claim 1, wherein the gap spacing is chosen within a range of 250 μm to 1500 μm.

14. The method according to claim 1, wherein a voltage rise time defines a shortest time interval for said AC-voltage to reach its maximum value starting from zero, and wherein said voltage rise time of the AC-voltage is in the range of 0.1 to 10 kV/μs.

15. The method according to claim 1, wherein current density through said plasma is less than 10 mA/cm$^2$.

16. The method according claim 1, used for treating a substrate in said discharge space with a chemical vapor deposition process using said plasma.

17. The method according to claim 1 wherein the gaseous substance comprises at least one of argon, nitrogen or air.

18. The method according to claim 17, wherein at least one further gas is provided to said gaseous substance in said discharge space.

19. The method according to claim 18, comprising at least the steps of: providing said further gas to said discharge space after essentially stabilizing said plasma such that the concentration of said further gas is fractionally increased stepwise; and stabilizing said plasma by adjusting said AC-voltage after each stepwise of said concentration of said further gas.

20. The method according to claim 18, wherein said at least one further gas is provided to said gaseous substance m a concentration of at most 50% by volume.

21. The method according to claim 20, wherein said concentration is at most 20% by volume.

22. The method according to claim 20, wherein said at least one further gas provided to said gaseous substance in said discharge space is comprised of at least one of $O_2$, $CO_2$, $NH_3$, SiH4, hydrocarbons, organosilicons, TEOS, HMDSO, organo-metallics or combinations thereof.

23. The method according to claim 18, wherein said at least one further gas provided to said gaseous substance in said discharge space is comprised of at least one of $O_2$, $CO_2$, $NH_3$, SiH4, hydrocarbons, organosilicons, TEOS, HMDSO, organo-metallics or combinations thereof.

24. The method according to claim 23, wherein said gaseous substance provided in said discharge space is flowed through said discharge space, establishing a gas flow.

25. The method according to claim 24, wherein said gas flow has a flow rate in a range oil 1 l/min to 50 l/min.

26. The method according to claim 24, wherein the velocity of the gas flow is in the range of 0.1-10 m/s.

27. The method according to claim 26, wherein the velocity of the gas flow is in the range of 1-5 m/s.

28. A method for generating an atmospheric pressure glow discharge plasma (APG) and for treating a substrate under controlled temperature conditions, wherein a plurality of opposing plate electrodes are arranged defining a discharge space there between in which the APG plasma is formed and through which a substrate to be treated thereby is moved, wherein said plate electrodes are connected to a power supply and an AC-voltage is applied to said plate electrodes, and wherein said a gaseous substance is provided into said discharge space in the form of a carrier gas including at least one of a group comprising argon, nitrogen and air, wherein said AC-voltage applied to said plate electrodes has an amplitude equal to or less than 140% of a breakdown voltage of said gaseous substance and has a frequency of at least 100 kHz, with the type, concentration or composition of the carrier gas being modified byte addition of further gases while the glow discharge plasma is in operation, and wherein the amplitude of the AC-voltage is variable and controlled to be dependent upon the breakdown voltage of the changing gaseous substance as it is modified to maintain their relationship to thereby control and reduce the temperature applied to the substrate being treated by said APG plasma for preventing thermal damage to substrate.

* * * * *